United States Patent
Yang et al.

(10) Patent No.: US 11,794,219 B2
(45) Date of Patent: Oct. 24, 2023

(54) LIQUID SUPPLY UNIT AND SUBSTRATE TREATING APPARATUS AND METHOD

(71) Applicant: SEMES CO., LTD., Cheonan-si (KR)

(72) Inventors: Seungtae Yang, Yongin-si (KR);
Buyoung Jung, Cheonan-si (KR);
Seung Hwan Cho, Ulsan (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 266 days.

(21) Appl. No.: 16/912,754

(22) Filed: Jun. 26, 2020

(65) Prior Publication Data
US 2020/0406309 A1    Dec. 31, 2020

(30) Foreign Application Priority Data
Jun. 27, 2019 (KR) .......... 10-2019-0076767

(51) Int. Cl.
*B08B 3/10* (2006.01)
*H01L 21/67* (2006.01)

(52) U.S. Cl.
CPC .......... *B08B 3/10* (2013.01); *H01L 21/67051* (2013.01)

(58) Field of Classification Search
CPC ............................ B08B 3/10; H01L 21/67051
USPC ....................................................... 134/198
See application file for complete search history.

(56) References Cited

U.S. PATENT DOCUMENTS

| 6,221,167 B1* | 4/2001 | Karasawa ......... H01L 21/67051 134/107 |
| 2019/0131144 A1* | 5/2019 | Iwahata ............ H01L 21/67109 |

FOREIGN PATENT DOCUMENTS

| JP | H097147 A | 1/1997 |
| JP | H11-226387 A | 8/1999 |
| JP | 2000-124185 A | 4/2000 |
| JP | 2008-066505 A | 3/2008 |
| JP | 2019-079995 A | 5/2019 |
| KR | 10-2003-0021581 A | 3/2003 |
| KR | 10-2009-0047251 A | 5/2009 |
| TW | 200403751 A | 3/2004 |
| TW | 200618108 A | 6/2006 |

OTHER PUBLICATIONS

KR20090047251A—Machine translation (Year: 2009).*
(Continued)

*Primary Examiner* — Tinsae B Ayalew
(74) *Attorney, Agent, or Firm* — Harness, Dickey & Pierce, P.L.C.

(57) ABSTRACT

The inventive concept relates to an apparatus for treating a substrate. According to an embodiment, the substrate treating apparatus includes a housing having a process space therein, a support unit that supports the substrate in the housing, a nozzle that dispenses a treatment liquid onto the substrate supported on the support unit, and a liquid supply unit that supplies the treatment liquid to the nozzle, in which the liquid supply unit includes a container having a storage space in which the treatment liquid is stored, a liquid supply tube that causes the treatment liquid to flow from the container to the nozzle, and a microwave applying member that applies microwaves to the treatment liquid before the treatment liquid is supplied to the nozzle.

15 Claims, 4 Drawing Sheets

(56) References Cited

OTHER PUBLICATIONS

Campbell et al., "Rapid Microwave Synthesis and Purification of Porous Covalent Organic Frameworks", Chemistry of Materials, dated Jan. 5, 2009.
Ferrari et al., "Microwave-Assisted Superheating and/or Microwave-Specific Superboiling (Nucleation-Limited Boiling) of Liquids Occurs under Certain Conditions but is Mitigated by Stirring", Department of Chemistry and Biochemistry, Florida State University, dated and Published Dec. 4, 2015.
CA Office Action for Korean Application No. 10-2019-0076767 dated Sep. 1, 2020.
Taiwanese Office Action dated Oct. 31, 2022 issued in Taiwanese Patent Application No. 11121072470.
Japanese Office Action dated Dec. 6, 2022 issued in Japanese Patent Application No. 2020-110237.
Japanese Office Action dated May 30, 2023 issued in corresponding Japanese Appln. No. 2020-110237.

* cited by examiner

LIQUID SUPPLY UNIT AND SUBSTRATE TREATING APPARATUS AND METHOD

CROSS-REFERENCE TO RELATED APPLICATIONS

A claim for priority under 35 U.S.C. § 119 is made to Korean Patent Application No. 10-2019-0076767 filed on Jun. 27, 2019, in the Korean Intellectual Property Office, the entire contents of which are hereby incorporated by reference.

BACKGROUND

Embodiments of the inventive concept described herein relate to an apparatus and method for treating a substrate, and more particularly, relate to a substrate treating apparatus and method for treating a substrate by dispensing a liquid onto the substrate.

To manufacture semiconductor elements, various processes, such as photolithography, deposition, ashing, etching, ion implantation, and the like, are performed on a substrate. Before and after these processes, a cleaning process is performed to clean particles remaining on the substrate.

The cleaning process is performed using various types of cleaning solutions. Among the cleaning solutions used for the substrate cleaning process, isopropyl alcohol (hereinafter, referred to as "IPA") is widely used to clean a substrate due to its low surface tension.

A substrate cleaning apparatus using IPA includes an IPA supply unit and a cleaning unit. The IPA supply unit includes a central chemical supply system (CCSS). For example, the central chemical supply system includes various types of chemical tanks and supply lines for supplying the IPA from the chemical tanks to the cleaning unit.

The IPA in the chemical tanks is supplied to the cleaning unit by supplying a pressurization gas (e.g., nitrogen gas) into the chemical tanks, and to raise the temperature of the IPA, heaters are inserted in the chemical tanks or the supply lines. Heating wires are mainly used as the heaters. The cleaning unit removes foreign matter on a substrate by dispensing the IPA supplied from the IPA supply unit onto the substrate.

However, the substrate cleaning apparatus as described above has a problem in that impurities in the IPA and the temperature of the IPA are difficult to manage.

For example, when a substrate cleaning process is not performed in the substrate cleaning apparatus, organic impurities may be generated due to stagnation of the IPA in the supply lines for supplying the IPA to the cleaning unit. Furthermore, in the case where the heaters are located in the supply lines or in the tanks for storing the PIA, the heaters may contaminate the IPA.

In the organic impurities or the contaminated IPA, particles not filtered by filters installed in the supply lines exist, and when the IPA containing the particles is dispensed onto the substrate, the particles adhere to the substrate so that the substrate is not effectively cleaned.

In the case of the heaters including the heating wires, it takes considerable time to raise the temperature of the IPA. Furthermore, it is difficult to dispense the IPA at desired temperature onto the substrate. For example, as the IPA moves along the supply lines, the temperature of the IPA is gradually lowered, and the IPA at a lower temperature than a set temperature is dispensed onto the substrate.

When the particles are contained in the IPA or the temperature of the IPA is not sufficiently high, substrate cleaning efficiency is lowered.

SUMMARY

Embodiments of the inventive concept provide a substrate treating apparatus and method for improving cleaning efficiency.

Embodiments of the inventive concept provide a substrate treating apparatus and method for efficiently removing impurities in a cleaning solution.

Embodiments of the inventive concept provide a substrate treating apparatus and method for raising the temperature of a cleaning solution to a desired temperature for a short period of time.

The technical problems to be solved by the inventive concept are not limited to the aforementioned problems, and any other technical problems not mentioned herein will be clearly understood from the following description by those skilled in the art to which the inventive concept pertains.

According to an exemplary embodiment, an apparatus for treating a substrate includes a housing having a process space therein, a support unit that supports the substrate in the housing, a nozzle that dispenses a treatment liquid onto the substrate supported on the support unit, and a liquid supply unit that supplies the treatment liquid to the nozzle, in which the liquid supply unit includes a container having a storage space in which the treatment liquid is stored, a liquid supply tube that causes the treatment liquid to flow from the container to the nozzle, and a microwave applying member that applies microwaves to the treatment liquid before the treatment liquid is supplied to the nozzle.

According to an embodiment, the apparatus may further include a filter installed in the liquid supply tube to filter impurities from the treatment liquid to be supplied to the nozzle.

According to an embodiment, the microwave applying member may be disposed upstream of the filter to coagulate the impurities in the treatment liquid.

According to an embodiment, in the liquid supply tube, a valve may be installed upstream of the filter, and the microwave applying member may be installed downstream of the valve.

According to an embodiment, in the liquid supply tube, a pump may be installed upstream of the filter, and the microwave applying member may be installed downstream of the pump.

According to an embodiment, in the liquid supply tube, a flow meter may be installed upstream of the filter, and the microwave applying member may be installed downstream of the flow meter.

According to an embodiment, the microwave applying member may be disposed downstream of the filter to heat the treatment liquid.

According to an embodiment, the microwave applying member may be provided adjacent to the nozzle.

According to an embodiment, the microwave applying member may be installed in the container to apply the microwaves to the treatment liquid in the container.

According to an embodiment, the apparatus may further include a cover that is disposed in the container and that surrounds the microwave applying member. The cover may be formed of a material through which the microwaves transmit, and the container may be formed of a material through which the microwaves do not transmit and may block emission of the microwaves to the outside of the container.

According to an embodiment, the microwave applying member may be installed in the liquid supply tube.

According to an embodiment, the microwave applying member may include a first microwave applying member that applies first microwaves to coagulate impurities in the treatment liquid and a second microwave applying member that applies second microwaves to heat the treatment liquid, and the second microwave applying member may provide microwaves with a lower output than the first microwave applying member.

According to an embodiment, the apparatus may further include a filter installed in the liquid supply tube to filter the impurities from the treatment liquid to be supplied to the nozzle. The first microwave applying member may be disposed upstream of the filter, and the second microwave applying member may be disposed downstream of the filter.

According to an embodiment, in the liquid supply tube, a valve may be installed upstream of the filter, and the first microwave applying member may be installed downstream of the valve.

According to an embodiment, in the liquid supply tube, a pump may be installed upstream of the filter, and the first microwave applying member may be installed downstream of the pump.

According to an embodiment, in the liquid supply tube, a flow meter may be installed upstream of the filter, and the first microwave applying member may be installed downstream of the flow meter.

According to an exemplary embodiment, a liquid supply unit includes a container having a storage space in which a treatment liquid is stored, a liquid supply tube that causes the treatment liquid to flow from the container to a nozzle, and a first microwave applying member that applies first microwaves to the treatment liquid to coagulate impurities in the treatment liquid before the treatment liquid is supplied to the nozzle.

According to an embodiment, the liquid supply unit may further include a second microwave applying member that applies second microwaves to heat the treatment liquid, and the second microwave applying member may provide microwaves with a lower output than the first microwave applying member.

According to an embodiment, the liquid supply unit may further include a filter installed in the liquid supply tube to filter the impurities from the treatment liquid to be supplied to the nozzle. The first microwave applying member may be disposed upstream of the filter, and the second microwave applying member may be disposed downstream of the filter.

According to an embodiment, the second microwave applying member may be provided adjacent to the nozzle.

According to an embodiment, the treatment liquid may include an organic solvent.

According to an exemplary embodiment, a method for treating a substrate includes treating the substrate by dispensing a treatment liquid onto the substrate, in which first microwaves are applied to the treatment liquid to coagulate impurities in the treatment liquid, and thereafter the coagulated impurities in the treatment liquid are filtered through a filter before the treatment liquid is dispensed onto the substrate.

According to an embodiment, second microwaves may be applied to the treatment liquid to heat the treatment liquid before the treatment liquid is dispensed onto the substrate.

According to an embodiment, the second microwaves may have a lower output than the first microwaves.

According to an embodiment, the second microwaves may be applied to the treatment liquid before the treatment liquid passing through the filter is dispensed onto the substrate.

According to an embodiment, the treatment liquid may be an organic solvent.

According to an embodiment, the treatment liquid may be isopropyl alcohol (IPA).

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
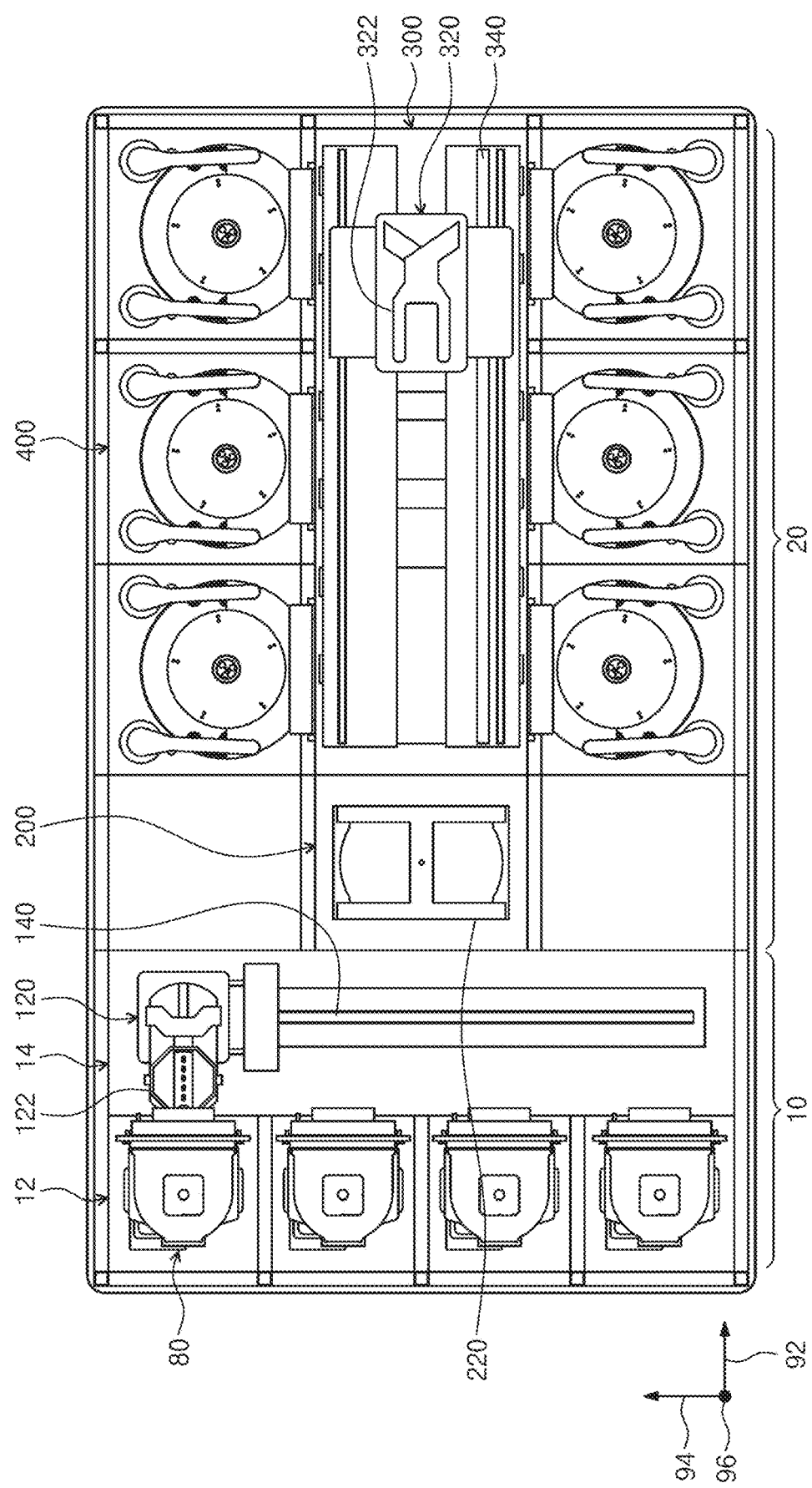
FIG. 1 is a schematic plan view illustrating a substrate treating apparatus according to an embodiment of the inventive concept.

Hereinafter, embodiments of the inventive concept will be described in more detail with reference to the accompanying drawings. The inventive concept may, however, be embodied in different forms and should not be construed as limited to the embodiments set forth herein. Rather, these embodiments are provided so that this disclosure will be thorough and complete, and will fully convey the scope of the inventive concept to those skilled in the art. In the drawings, the dimensions of components are exaggerated for clarity of illustration.

In this embodiment, a cleaning process of treating a substrate using a chemical and a rinsing solution will be described as an example. Without being limited to the cleaning process, however, this embodiment is able to be applied to a process (e.g., an etching process, an ashing process, a developing process, or the like) of treating a substrate using a treatment liquid.

FIG. 1 is a schematic plan view illustrating a substrate treating apparatus according to an embodiment of the inventive concept. Referring to FIG. 1, the substrate treating apparatus includes an index module 10 and a process module 20. According to an embodiment, the index module 10 and the process module 20 are disposed along one direction. Hereinafter, a direction in which the index module 10 and the process module 20 are disposed is referred to as a first direction 92, a direction perpendicular to the first direction 92 when viewed from above is referred to as a second direction 94, and a direction perpendicular to both the first direction 92 and the second direction 94 is referred to as a third direction 96.

The index module 10 transfers substrates W from carriers 80 to the process module 20 and places, in the carriers 80, the substrates W completely treated in the process module 20. The lengthwise direction of the index module 10 is parallel to the second direction 94. The index module 10 has a plurality of load ports 12 and an index frame 14. The load ports 12 are located on the opposite side to the process module 20 with respect to the index frame 14. The carriers 80 having the substrates W received therein are placed on the load ports 12. The plurality of load ports 12 may be disposed along the second direction 94.

Airtight carriers, such as front open unified pods (FOUPs), may be used as the carriers 80. The carriers 80 may be placed on the load ports 12 by a transfer unit (not illustrated) such as an overhead transfer, an overhead conveyor, or an automatic guided vehicle, or by an operator An index robot 120 is provided in the index frame 14. A guide rail 140, the lengthwise direction of which is parallel to the second direction 94, is provided in the index frame 14 and the index robot 120 is movable along the guide rail 140. The index robot 120 includes a hand 122 on which the substrate W is placed, and the hand 122 is movable forward and backward, rotatable about an axis facing in the third direction 96, and movable along the third direction 96. A plurality of hands 122 may be provided to be spaced apart from each other in the vertical direction. The hands 122 may independently move forward and backward.

The process module 20 includes a buffer unit 200, a transfer chamber 300, and liquid treatment chambers 400. The buffer unit 200 provides a space in which the substrates W loaded into the process module 20 and the substrates W to be unloaded from the process module 20 temporarily stay. Each of the liquid treatment chambers 400 performs a liquid treatment process of treating the substrate W by dispensing a liquid onto the substrate W. The transfer chamber 300 transfers the substrates W between the buffer unit 200 and the liquid treatment chambers 400.

The transfer chamber 300 may be disposed such that the lengthwise direction thereof is parallel to the first direction 92. The buffer unit 200 may be disposed between the index module 10 and the transfer chamber 300. The liquid treatment chambers 400 may be disposed on opposite sides of the transfer chamber 300. The liquid treatment chambers 400 and the transfer chamber 300 may be disposed along the second direction 94. The buffer unit 200 may be located at one end of the transfer chamber 300.

According to an embodiment, on one side of the transfer chamber 300, the liquid treatment chambers 400 may be arranged in an A×B array (A and B being natural numbers of 1 or larger) along the first direction 92 and the third direction 96.

The transfer chamber 300 has a transfer robot 320. A guide rail 340, the lengthwise direction of which is parallel to the first direction 92, may be provided in the transfer chamber 300, and the transfer robot 320 is movable on the guide rail 340. The transfer robot 320 includes a hand 322 on which the substrate W is placed. The hand 322 is movable forward and backward, rotatable about an axis facing in the third direction 96, and movable along the third direction 96. A plurality of hands 322 may be provided to be spaced apart from each other in the vertical direction. The hands 322 may independently move forward and backward.

The buffer unit 200 includes a plurality of buffers 220 in which the substrates W are placed. The buffers 220 may be disposed to be spaced apart from each other along the third direction 96. A front face and a rear face of the buffer unit 200 are open. The front face is opposite the index module 10, and the rear face is opposite the transfer chamber 300. The index robot 120 may approach the buffer unit 200 through the front face, and the transfer robot 320 may approach the buffer unit 200 through the rear face.

Figure 2:
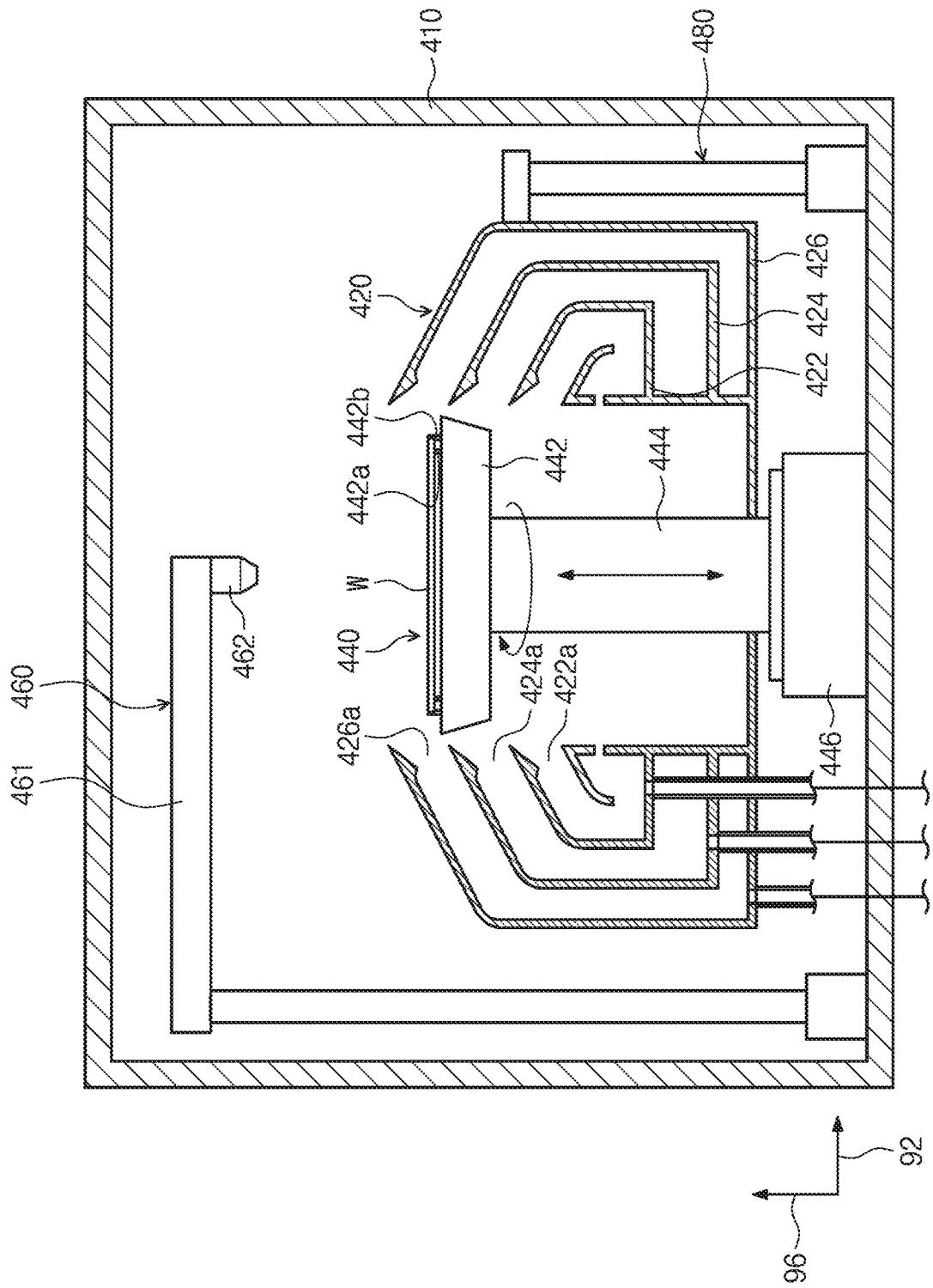
FIG. 2 is a schematic view illustrating one embodiment of liquid treatment chambers of FIG. 1.

FIG. 2 is a schematic view illustrating one embodiment of the liquid treatment chambers 400 of FIG. 1. Referring to FIG. 2, the liquid treatment chamber 400 has a housing 410, a cup 420, a support unit 440, a liquid dispensing unit 460, and a lifting unit 480.

The housing 410 has a substantially rectangular parallelepiped shape. The cup 420, the support unit 440, and the liquid dispensing unit 460 are disposed in the housing 410.

The cup 420 has a process space that is open at the top, and a substrate W is treated with a liquid in the process space. The support unit 440 supports the substrate W in the process space. The liquid dispensing unit 460 dispenses the liquid onto the substrate W supported on the support unit 440. A plurality of types of liquids may be sequentially dispensed onto the substrate W. The lifting unit 480 adjusts the height of the cup 420 relative to the support unit 440.

According to an embodiment, the cup 420 has a plurality of recovery bowls 422, 424, and 426. The recovery bowls 422, 424, and 426 have recovery spaces for recovering the liquids used to treat the substrate W. The recovery bowls 422, 424, and 426 have a ring shape that surrounds the support unit 440. The treatment liquids scattered by rotation of the substrate W during liquid treatment processes may be introduced into the recovery spaces through inlets 422a, 424a, and 426a of the respective recovery bowls 422, 424, and 426.

According to an embodiment, the cup 420 has the first recovery bowl 422, the second recovery bowl 424, and the third recovery bowl 426. The first recovery bowl 422 is disposed to surround the support unit 440, the second recovery bowl 424 is disposed to surround the first recovery bowl 422, and the third recovery bowl 426 is disposed to surround the second recovery bowl 424. The second inlet 424a through which a liquid is introduced into the second recovery bowl 424 may be located in a higher position than the first inlet 422a through which a liquid is introduced into the first recovery bowl 422, and the third inlet 426a through which a liquid is introduced into the third recovery bowl 426 may be located in a higher position than the second inlet 424a.

The support unit 440 has a support plate 442 and a drive shaft 444. An upper surface of the support plate 442 may have a substantially circular shape and may have a larger diameter than the substrate W. Support pins 442a are provided on a central portion of the support plate 442 to support the backside of the substrate W. The support pins 442a protrude upward from the support plate 442 to cause the substrate W to be spaced apart from the support plate 442 by a predetermined distance.

Chuck pins 442b are provided on an edge portion of the support plate 442. The chuck pins 442b protrude upward from the support plate 442 and support a lateral portion of the substrate W to prevent the substrate W from escaping from the support unit 440 when being rotated. The drive shaft 444 is driven by an actuator 446. The drive shaft 444 is connected to the center of a bottom surface of the support plate 442 and rotates the support plate 442 about the central axis thereof.

The lifting unit 480 moves the cup 420 in the vertical direction. The relative height between the cup 420 and the substrate W is changed by the vertical movement of the cup 420. Accordingly, the recovery bowls 422, 424, and 426 for recovering the treatment liquids may be changed depending on the types of liquids dispensed onto the substrate W, and thus the liquids may be separately recovered. Unlike the above description, the cup 420 may be fixedly installed, and the lifting unit 480 may move the support unit 440 in the vertical direction.

The liquid dispensing unit 460 dispenses a treatment liquid onto the substrate W. The liquid dispensing unit 460 includes an arm 461 and a nozzle 462 that is fixedly coupled to an end of the arm 461 and that dispenses the liquid onto the substrate W.

According to an embodiment, a plurality of liquid dispensing units 460 may be provided. The plurality of liquid dispensing units 460 may dispense different types of treatment liquids onto the substrate W. The treatment liquids may include a chemical, a rinsing solution, and an organic solvent. The chemical may include diluted sulfuric acid ($H_2SO_4$), phosphoric acid ($P_2O_5$), hydrofluoric acid (HF), and ammonium hydroxide ($NH_4OH$). The rinsing liquid may be deionized water.

Figure 3:
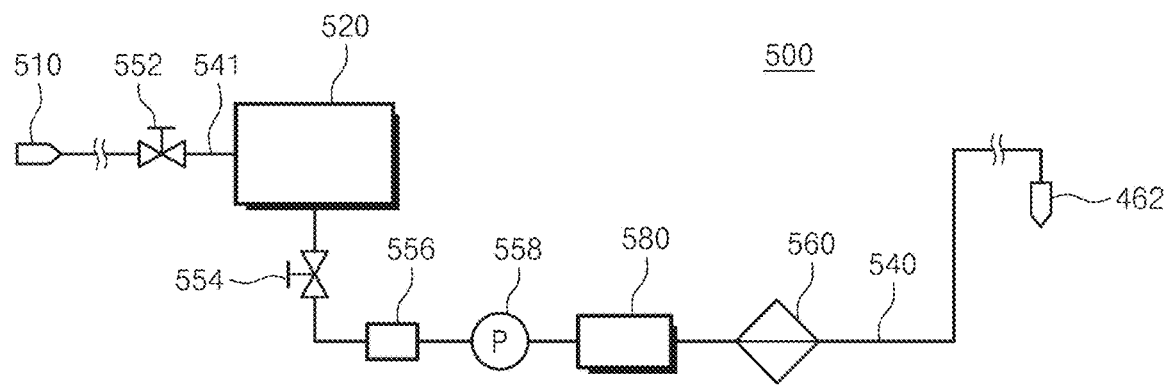
FIGS. 3 to 5 are schematic views illustrating liquid supply units according to embodiments of the inventive concept.

A liquid supply unit 500 supplies a treatment liquid to the liquid dispensing unit 460. In FIG. 3 and the following drawings, it will be exemplified that the liquid supply unit 500 supplies an organic solvent, such as isopropyl alcohol, as the treatment liquid. Embodiments of the inventive concept will be described in detail with reference to FIGS. 3 to 6.

As described above, the treatment liquid dispensed by the liquid dispensing unit 460 may include a chemical, a rinsing solution, and an organic solvent. In the following embodiments, it will be exemplified that an organic solvent is dispensed to dry the substrate W. In an embodiment, the organic solvent may be isopropyl alcohol (IPA).

The liquid supply unit 500 may include a treatment liquid source 510, a container 520, a liquid supply tube 540, a filter 560, and a microwave applying member 580.

The treatment liquid source 510 supplies IPA into the container 520. The treatment liquid source 510 and the container 520 are connected by an inlet tube 541, and a valve 552 is installed in the inlet tube 541. The valve 552 may be an open/close valve or a flow-rate control valve. The container 520 receives the IPA from the treatment liquid source 510 and stores the IPA. The treatment liquid in the container 520 is supplied to the nozzle 462. The container 520 and the nozzle 462 are connected by the liquid supply tube 540.

The microwave applying member 580 applies microwaves to the IPA to coagulate impurities in the IPA or raise the temperature of the IPA before the IPA is supplied to the nozzle 462.

FIG. 3 is a schematic view illustrating one embodiment of the liquid supply unit 500. Referring to FIG. 3, the microwave applying member 580 is disposed upstream of the filter 560 and applies microwaves to the IPA solution flowing through the liquid supply tube 540. Accordingly, before the IPA solution flowing through the liquid supply tube 540 reaches the filter 560, the impurities are coagulated in the IPA solution, and the sizes of the impurities are increased.

In general, there is a limitation in the sizes of particles filtered through the filter 560, and therefore fine particles are not filtered by the filter 560. In particular, fine organic impurities not filtered by the filter 560 exist in the IPA solution. Accordingly, even though the filter 560 is installed in the liquid supply tube 540, fine impurities still exist in the IPA solution supplied to the nozzle 462.

The microwave applying member 580 applies microwaves to the IPA solution upstream of the filter 560. Accordingly, the fine organic impurities existing in the IPA solution are coagulated, and when the IPA solution passes through the filter 560, most of the coagulated organic impurities in the IPA are filtered by the filter 560.

A valve 554 and a flow meter 556 may be installed in the liquid supply tube 540. The valve 554 may adjust the flow rate of the IPA solution supplied from the container 520. The valve 554 may be an open/close valve or a flow-rate control valve. The flow meter 556 may directly or indirectly measure the flow rate of the IPA solution flowing through the liquid supply tube 540.

According to an embodiment, the microwave applying member 580 is disposed upstream of the filter 560, but downstream of the valve 554, a pump 558, and the flow meter 556 that are installed in the liquid supply tube 540. This allows impurities generated when the IPA solution passes through the valve 554, the pump 558, or the flow meter 556 to be filtered by the filter 560.

When the flow of the IPA stagnates in the liquid supply tube 540, impurities are generated in the IPA. To prevent this, a conventional liquid supply unit indispensably includes an IPA circulation path for a continuous flow of IPA. However, the liquid supply unit 500 of the inventive concept coagulates the impurities in the IPA upstream of the filter 560 and allows the impurities to be filtered through the filter 560. Accordingly, an IPA circulation path may be reduced or omitted.

Figure 4:
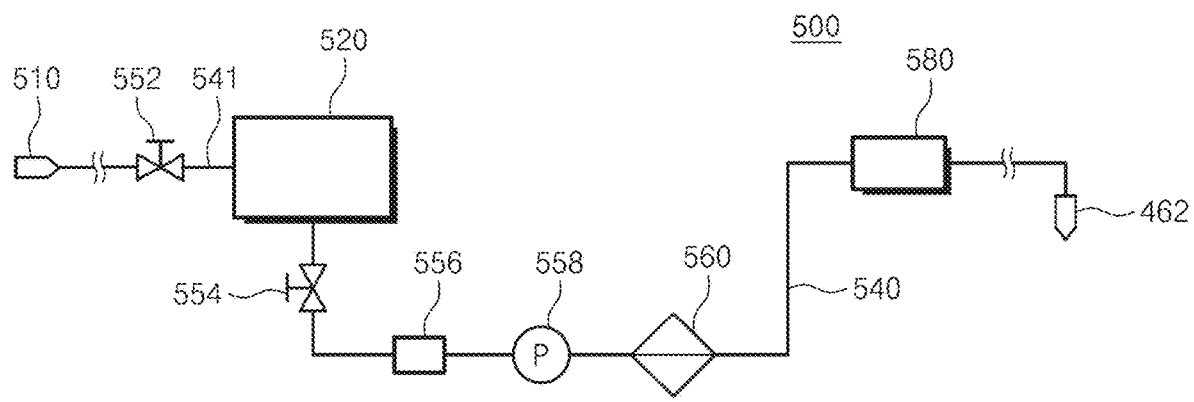

FIG. 4 illustrates another example of the liquid supply unit 500 of the inventive concept. Referring to FIG. 4, the microwave applying member 580 is disposed downstream of the filter 560. The microwave applying member 580 may heat IPA.

Because microwaves act on the IPA on a molecular basis, time taken to raise the temperature of the IPA to a desired process temperature is reduced, as compared with when the temperature of the IPA is raised through a heater equipped with a conventional heating wire. Furthermore, unlike the conventional heating wire, microwaves do not leave residual heat in the microwave applying member 580 when the supply of power is interrupted, and thus easy temperature control is achieved.

As the IPA moves along the liquid supply tube 540, the temperature of the IPA is lowered. In a case where the microwave applying member 580 is disposed far away from the nozzle 462, the temperature of the IPA solution is lowered while the IPA solution heated to the process temperature flows along the liquid supply tube 540, and the temperature of the IPA solution when the IPA solution is dispensed onto the substrate W is lower than the required process temperature. To prevent this, the microwave applying member 580 may be provided adjacent to the nozzle 462 to raise the temperature of the IPA to the desired process temperature right before the IPA is dispensed onto the substrate W.

Selectively, the IPA solution may be heated to the process temperature by a heater upstream of the filter 560, and the microwave applying member 580 may compensate for the temperature of the IPA solution lowered while the IPA is supplied to the nozzle 462 after passing through the filter 560.

Figure 5:
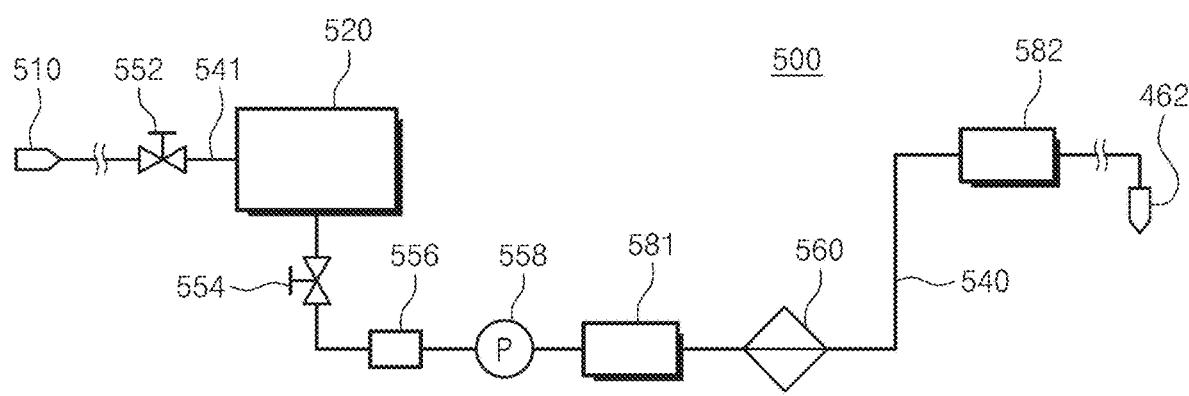

FIG. 5 is a schematic view illustrating another embodiment of the liquid supply unit 500. Referring to FIG. 5, the liquid supply unit 500 includes a first microwave applying member 581 and a second microwave applying member 582. Similar to the microwave applying member 580 of FIG. 3, the first microwave applying member 581 coagulates impurities in an IPA solution. Similar to the microwave applying member 580 of FIG. 4, the second microwave applying member 582 heats the IPA solution right before the IPA solution is supplied to the nozzle 462. That is, the first microwave applying member 581 is disposed upstream of the filter 560, and the second microwave applying member 582 is disposed downstream of the filter 560.

As the output of microwaves becomes higher, the impurities in the IPA are coagulated better, and the temperature of the IPA is raised to a higher temperature. In contrast, in a case where the output of the microwave applying member 580 is not sufficiently high, the impurities in the IPA are not coagulated well. In general, an IPA solution boils at about 82 degrees Celsius and is used at a temperature below about 82 degrees Celsius to treat a substrate.

The second microwave applying member 582 applies microwaves to the IPA solution at an output level at which the temperature of the IPA solution is able to be raised to a desired process temperature, and the first microwave applying member 581 applies microwaves to the IPA solution at a sufficiently high output level to coagulate the impurities in the IPA solution. For example, the first microwave applying member 581 may apply microwaves to the IPA solution at a higher output level than the second microwave applying member 582.

In FIGS. 3 and 4, it has been described that the microwave applying member 580 is installed in the liquid supply tube 540. However, as illustrated in FIG. 6, the microwave applying member 580 may be installed in the container 520 to apply microwaves to the treatment liquid in the container 520.

The microwave applying member 580 may perform a function of coagulating the impurities in the IPA solution in the container 520. Furthermore, the microwave applying member 580 may perform a function of heating the IPA solution in the container 520. The coagulation of the impurities in the IPA solution and the heating of the IPA solution may be simultaneously performed.

Figure 6:
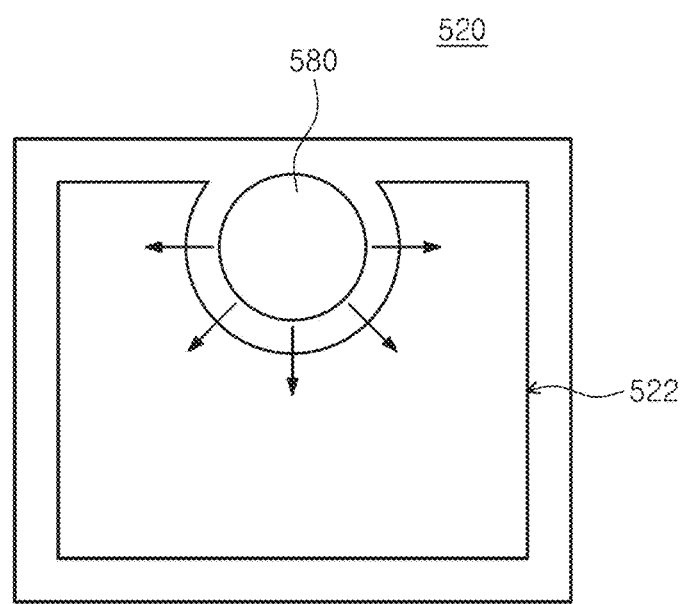
FIG. 6 is a schematic view illustrating the interior of a container according to an embodiment of the inventive concept in which a treatment liquid is received.

Referring to FIG. 6, the microwave applying member 580 is installed in the container 520. The container 520 may further include a cover 522 that surrounds the microwave applying member 580 inserted thereinto. The cover 522 is formed of a material through which microwaves transmit and allows the microwaves to be transferred to the IPA received in the container 520. The exterior of the container 520 may be formed of a material through which microwaves do not transmit and may block emission of the microwaves to the outside of the container 520. In an embodiment, the cover 522 may be formed of Teflon, and the exterior of the container 520 may be formed of stainless steel.

According to an embodiment of the inventive concept, before a treatment liquid passes through a filter, microwaves may be applied to the treatment liquid to coagulate impurities in the treatment liquid, thereby improving filtration efficiency.

Furthermore, according to an embodiment of the inventive concept, microwaves may be applied to a treatment liquid to raise the temperature of the treatment liquid for a short period of time.

In addition, according to an embodiment of the inventive concept, near a nozzle, microwaves may be applied to a treatment liquid, thereby preventing a phenomenon in which a cleaning solution at a lower temperature than a set temperature is dispensed onto a substrate.

Effects of the inventive concept are not limited to the above-described effects, and any other effects not mentioned herein may be clearly understood from this specification and the accompanying drawings by those skilled in the art to which the inventive concept pertains.

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. An apparatus for treating a substrate, the apparatus comprising:
   a housing having a process space therein;
   a support unit configured to support the substrate in the housing;
   a nozzle configured to dispense a treatment liquid onto the substrate supported on the support unit; and
   a liquid supply unit configured to supply the treatment liquid to the nozzle,
   wherein the liquid supply unit includes,
      a container having a storage space in which the treatment liquid is stored,
      a liquid supply tube configured to cause the treatment liquid to flow from the container to the nozzle, the liquid supply tube including a valve, a pump, and a flow meter installed therein,
      a filter installed in the liquid supply tube to filter impurities from the treatment liquid to be supplied to the nozzle, and
      a microwave applying member configured to apply microwaves to the treatment liquid before the treatment liquid is supplied to the nozzle, and the microwave applying member including,
      a first microwave applying member configured to apply first microwaves to heat the treatment liquid such that a temperature of the treatment liquid increases to a first temperature; and
      a second microwave applying member configured to apply second microwaves to heat the treatment liquid such that the temperature of the treatment liquid increases to a second temperature, the first temperature being higher than the second temperature, and
   wherein the first microwave applying member is disposed upstream of the filter to coagulate the impurities in the treatment liquid and the second microwave applying member is disposed downstream of the filter and before the nozzle.

2. The apparatus of claim 1, wherein in the liquid supply tube, the valve is installed upstream of the filter, and the microwave applying member is installed downstream of the valve.

3. The apparatus of claim 1, wherein in the liquid supply tube, the pump is installed upstream of the filter, and the microwave applying member is installed downstream of the pump.

4. The apparatus of claim 1, wherein in the liquid supply tube, the flow meter is installed upstream of the filter, and the microwave applying member is installed downstream of the flow meter.

5. The apparatus of claim 1, wherein the second microwave applying member is adjacent to the nozzle.

6. The apparatus of claim 1, wherein the first microwave applying member is installed in the container to apply the microwaves to the treatment liquid in the container.

7. The apparatus of claim 5, further comprising:
a cover disposed in the container and configured to surround the microwave applying member, wherein the cover is formed of a material through which the microwaves transmit,
wherein the container is formed of a material through which the microwaves do not transmit and is configured to block emission of the microwaves to an outside of the container.

8. The apparatus of claim 1, wherein the microwave applying member is installed in the liquid supply tube.

9. The apparatus of claim 1, wherein the second microwave applying member is configured to provide microwaves with a lower output than the first microwave applying member.

10. The apparatus of claim 9, wherein in the liquid supply tube, the valve is installed upstream of the filter, and the first microwave applying member is installed downstream of the valve.

11. The apparatus of claim 9, wherein in the liquid supply tube, the pump is installed upstream of the filter, and the first microwave applying member is installed downstream of the pump.

12. The apparatus of claim 9, wherein in the liquid supply tube, the flow meter is installed upstream of the filter, and the first microwave applying member is installed downstream of the flow meter.

13. A liquid supply unit comprising:
a container having a storage space and configured to store a treatment liquid;
a liquid supply tube configured to cause the treatment liquid to flow from the container to a nozzle, the liquid supply tube including a valve, a pump, and a flow meter installed therein;
a filter installed in the liquid supply tube to filter impurities from the treatment liquid to be supplied to the nozzle; and
a first microwave applying member configured to apply first microwaves to the treatment liquid to coagulate impurities in the treatment liquid before the treatment liquid is supplied to the nozzle such that a temperature of the treatment liquid increases to a first temperature,
a second microwave applying member configured to apply second microwaves to heat the treatment liquid before the treatment liquid is supplied to the nozzle such that the temperature of the treatment liquid increases to a second temperature, the first temperature being higher than the second temperature,
wherein the first microwave applying member is disposed upstream of the filter to coagulate the impurities in the treatment liquid and the second microwave applying member is disposed downstream of the filter and before the nozzle, and
the filter is disposed before the nozzle and downstream of the valve, the pump, and the flow meter.

14. The liquid supply unit of claim 13, wherein the second microwave applying member provides microwaves with a lower output than the first microwave applying member.

15. The liquid supply unit of claim 14, wherein the second microwave applying member is adjacent to the nozzle.

* * * * *